(12) United States Patent
Tsurumi

(10) Patent No.: US 7,420,413 B2
(45) Date of Patent: Sep. 2, 2008

(54) AMPLIFIER CIRCUIT OF BTL SYSTEM

(75) Inventor: Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 11/498,073

(22) Filed: Aug. 3, 2006

(65) Prior Publication Data

US 2007/0252645 A1    Nov. 1, 2007

(30) Foreign Application Priority Data

Aug. 5, 2005    (JP)    ................. 2005-228462

(51) Int. Cl.
    *H03F 3/45*    (2006.01)
(52) U.S. Cl. ..................................... 330/69; 330/295
(58) Field of Classification Search .................. None
    See application file for complete search history.

(56) References Cited

U.S. PATENT DOCUMENTS

| | | | | |
|---|---|---|---|---|
| 4,320,351 | A | * | 3/1982 | Brown et al. ................. 330/260 |
| 4,853,648 | A | | 8/1989 | Imanishi |
| 5,241,283 | A | * | 8/1993 | Sutterlin ...................... 330/51 |
| 5,568,561 | A | * | 10/1996 | Whitlock ..................... 381/120 |
| 6,160,446 | A | * | 12/2000 | Azimi et al. .................. 330/69 |
| 6,507,223 | B2 | * | 1/2003 | Felder .......................... 327/77 |
| 6,765,437 | B2 | | 7/2004 | Goutti et al. |
| 2007/0241813 | A1 | * | 10/2007 | Freeke ........................ 330/117 |

FOREIGN PATENT DOCUMENTS

JP              4-343506         11/1992

* cited by examiner

*Primary Examiner*—Robert J. Pascal
*Assistant Examiner*—Alan Wong
(74) *Attorney, Agent, or Firm*—Oblon, Spivak, McClelland, Maier & Neustadt, P.C.

(57) ABSTRACT

An amplifier circuit of a BTL system is disclosed, which comprises a first operational amplifier which outputs an output signal having a same phase as an input signal input to a signal input terminal, a second operational amplifier which outputs an output signal having an opposite phase to the input signal, a voltage divider which generates a midpoint voltage of the input signal, a first resistor connected between an output terminal and a negative phase input terminal of the first operational amplifier, second and third resistors connected in series between the negative phase input terminals of the first and second operational amplifiers, a fourth resistor connected between an output terminal and the negative phase input terminal of the second operational amplifier, and an impedance converter connected between a midpoint voltage node of the voltage divider and a series-connection node of the second and third resistors.

21 Claims, 4 Drawing Sheets

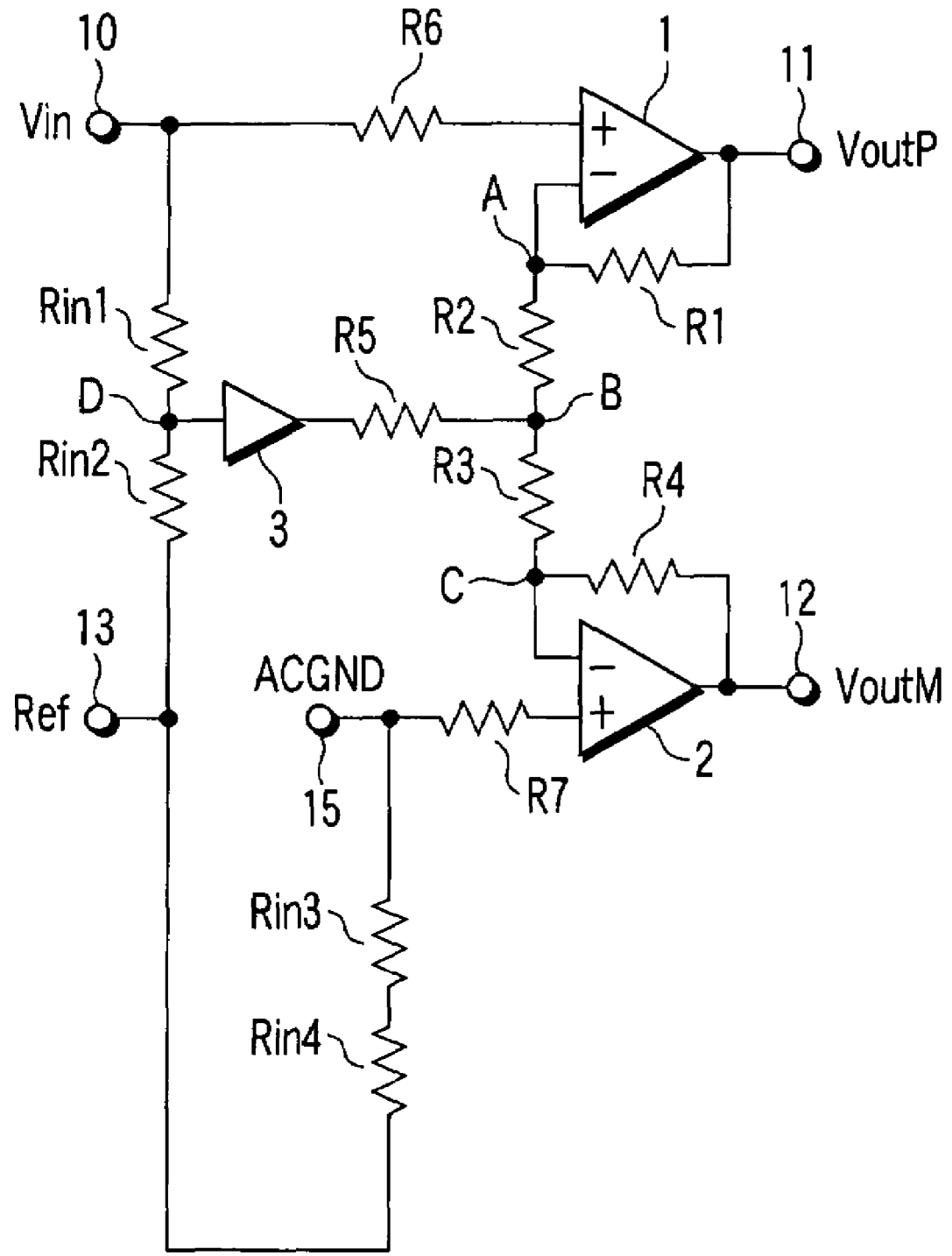
F I G. 5

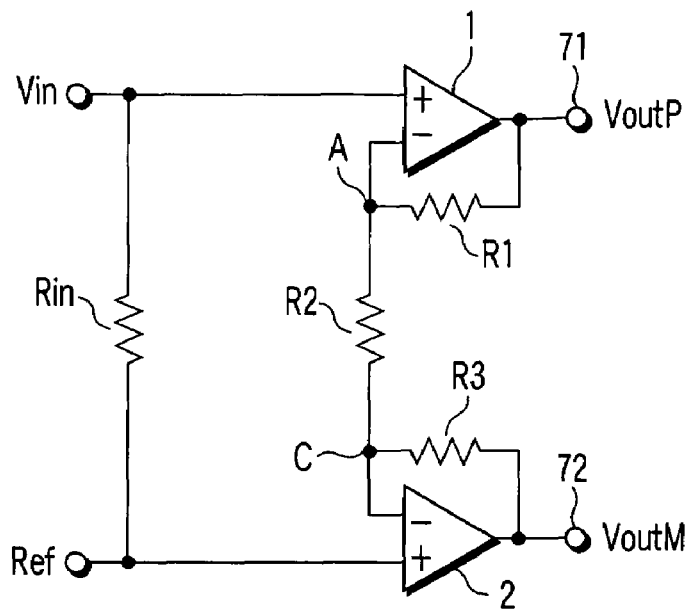
F I G. 6
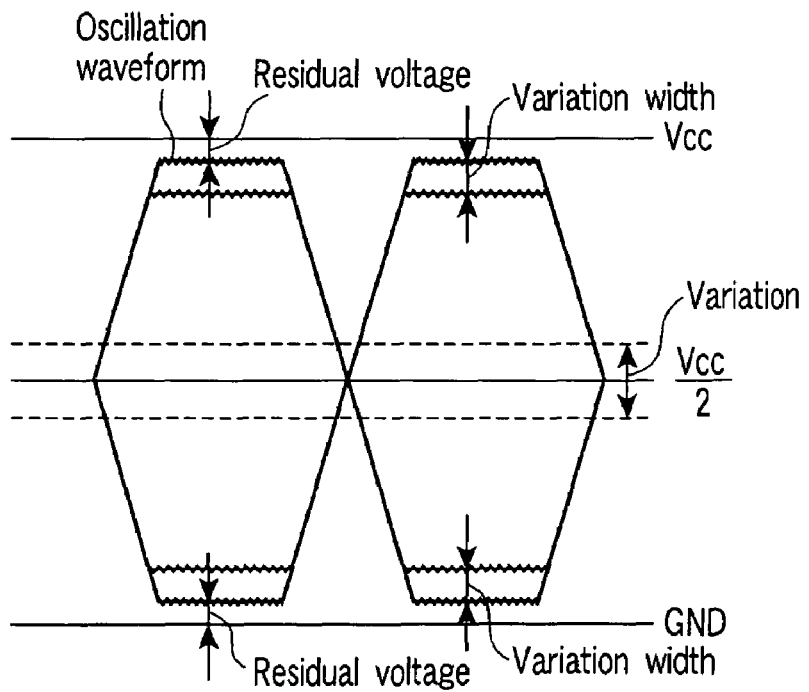
F I G. 7

AMPLIFIER CIRCUIT OF BTL SYSTEM

CROSS-REFERENCE TO RELATED APPLICATIONS

This application is based upon and claims the benefit of priority from prior Japanese Patent Application No. 2005-228462, filed Aug. 5, 2005, the entire contents of which are incorporated herein by reference.

BACKGROUND OF THE INVENTION

1. Field of the Invention

The present invention relates to an amplification circuit, and in particular, to a power amplifier of a bridge tied load (BTL) system for audio (a BTL power amplifier), which is used for, for example, a power amplifier for car audio of a high output specification.

2. Description of the Related Art

In a conventional BTL power amplifier, an input signal Vin is subjected to voltage-current conversion (V-I conversion) at a gm amplifier serving as a preamplifier to be made into a BTL signal current, and the BTL signal current is output to a circuit formed of first and second resistance elements connected in series. The series-connection node of the first and second resistance elements are connected to a reference input terminal. A voltage generated across the first resistance element is amplified by a first operational amplifier, and is output from the first operational amplifier as a same phase output voltage VoutP having the same phase as the input signal Vin. On the other hand, a voltage generated across the second resistance element is amplified by a second operational amplifier, and the amplified voltage is output from the second operational amplifier as an opposite phase output voltage VoutM having an opposite phase to the input signal Vin. A closed loop gain GvP of the first operational amplifier and a closed loop gain GvM of the second operational amplifier can be given by the following expressions (1) and (2).

$$GvP = \frac{VoutP}{Vin} = gm \cdot R3 \cdot \frac{R1 + R2}{R2} \quad (1)$$

$$GvM = \frac{VoutM}{Vin} = -gm \cdot R6 \cdot \frac{R4 + R5}{R5} \quad (2)$$

Assuming that feedback quantity of the first operational amplifier and the second operational amplifier are defined as f1 and f2, respectively, f1 and f2 can be given by the following expressions (3) and (4).

$$f1 = \frac{R2}{R1 + R2} \quad (3)$$

$$f2 = \frac{R5}{R4 + R5} \quad (4)$$

The feedback quantity do not depend on a frequency and is at a fixed value, and thus the BTL power amplifier of the above configuration is excellent in oscillation stability. In addition, since the circuit configuration of the first operational amplifier is the same as that of the second operational amplifier, the BTL power amplifier according to the above configuration has advantages that the circuit structure can be made symmetric and the circuit designing can be made easy.

However, in the power amplifier configured as described above, a noise and an offset voltage generated in the gm amplifier are amplified by the first operational amplifier and the second operational amplifier. Thus, the power amplifier as described above is unsuitable for use in a power amplifier of a low noise and a low offset voltage. Particularly, in the case of applying the circuit of the above configuration to an audio power amplifier or the like which is made into an integrated circuit, a sound quality is deteriorated if the noise is large, and a POP noise becomes large if the offset voltage is large. In order to attain a low offset voltage, high accuracy is required for elements forming the gm amplifier, which increases the chip area of the gm amplifier.

A concrete example of the gm amplifier, which is a preamplifier in the BTL power amplifier circuit of the above configuration, is disclosed in Jpn. Pat. Appln. KOKAI Publication No. 4-343506.

BRIEF SUMMARY OF THE INVENTION

According to a first aspect of the present invention, there is provided an amplifier circuit of a BTL system, comprising:

a first operational amplifier circuit which outputs an output signal having a same phase as an input signal input to a signal input terminal;

a second operational amplifier circuit which outputs an output signal having an opposite phase to the input signal;

a voltage dividing circuit which generates a midpoint voltage of the input signal;

a first resistance element which is connected between an output terminal of the first operational amplifier circuit and a negative phase input terminal of the first operational amplifier circuit;

a second resistance element and a third resistance element which are connected in series between the negative phase input terminal of the first operational amplifier circuit and a negative phase input terminal of the second operational amplifier circuit;

a fourth resistance element which is connected between an output terminal of the second operational amplifier circuit and the negative phase input terminal of the second operational amplifier circuit; and an impedance conversion circuit which is connected between a midpoint voltage node of the voltage dividing circuit and a series-connection node of the second resistance element and the third resistance element.

According to a second aspect of the present invention, there is provided an amplifier circuit of a BTL system, comprising:

a first operational amplifier circuit which outputs an output signal having a same phase as an input signal input to a signal input terminal;

a second operational amplifier circuit which outputs an output signal having an opposite phase to the input signal;

a midpoint voltage generating circuit which generates a midpoint voltage of the input signal;

a first feedback circuit which is connected between an output terminal of the first operational amplifier circuit and a negative phase input terminal of the first operational amplifier circuit;

a series resistance circuit which is formed of series connected resistances which are connected in series between the negative phase input terminal of the first operational amplifier circuit and a negative phase input terminal of the second operational amplifier circuit;

a second feedback circuit which is connected between an output terminal of the second operational amplifier circuit and the negative phase input terminal of the second operational amplifier circuit; and an impedance conversion circuit which is connected between a midpoint voltage output node of the midpoint voltage generating circuit and a series-connection node of the series connected resistances of the series resistance circuit.

BRIEF DESCRIPTION OF THE SEVERAL VIEWS OF THE DRAWING

FIG. 5 is a circuit diagram of a BTL power amplifier according to a second embodiment of the present invention;

FIG. 6 is a circuit diagram of a BTL power amplifier for comparison with the BTL power amplifiers according to the embodiments of the present invention; and FIG. 7 is a waveform diagram showing the operation of the circuit shown in FIG. 6.

DETAILED DESCRIPTION OF THE INVENTION

Figure 1:
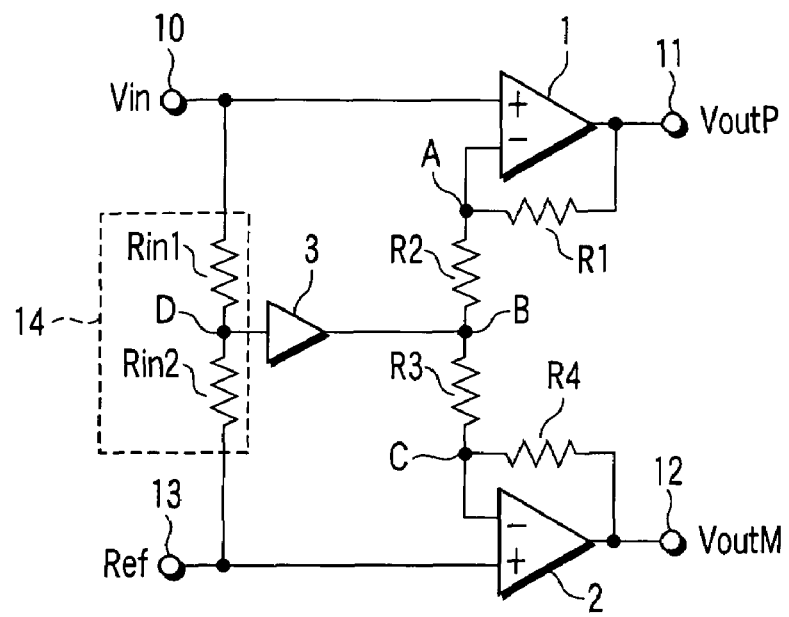
FIG. 1 is a circuit diagram of a BTL power amplifier according to a first embodiment of the present invention.

First, an amplifier circuit made by improving the conventional example for comparison with amplifier circuits of BTL system according to embodiments of the present invention will be described with reference to FIG. 6, before describing the amplifier circuits of BTL system according to the embodiments of the present invention.

FIG. 6 is a circuit diagram of a BTL power amplifier intending to solve the problems of the conventional power amplifier. In the BTL power amplifier shown in FIG. 6, an input signal Vin is input in a positive phase input terminal (+) of an operational amplifier 1, and an output voltage VoutP is output from a positive phase output terminal 71 of the operational amplifier 1. The positive phase output terminal 71 configures one output terminal of the BTL power amplifier. A reference voltage Ref is input to a positive phase input terminal (+) of an operational amplifier 2, and an output voltage VoutM is output from a negative phase output terminal 72 of the operational amplifier 2. The negative phase output terminal 72 configures the other output terminal of the BTL power amplifier. A resistance element R1 for feedback is connected between the positive phase output terminal 71 and a circuit point A which is connected to a negative phase input terminal (−) of the operational amplifier 1. Similarly, a resistance element R3 for feedback is connected between the negative phase output terminal 72 and a circuit point C which is connected to a negative phase input terminal (−) of the operational amplifier 2. A resistance element R2 is connected between the circuit point A and the circuit point C.

Since in the BTL power amplifier shown in FIG. 6 the BTL output signal is obtained from the input signal Vin, a gm amplifier used in the conventional BTL power amplifier is not required, and this makes it possible to expect a low noise and a low-output offset voltage. However, the BTL power amplifier shown in FIG. 6 involves problems as follows: (1) a large maximum output power cannot be obtained, and (2) the oscillation stability is low. Hereinafter, the operation and the problems of the circuit of FIG. 6 will be described in detail with reference to a waveform diagram shown in FIG. 7.

(1) The problem that a large maximum output power cannot be obtained will be described below. For example, the operation before and after the output voltage VoutP of the operational amplifier 1 is clipped will be considered. When the input voltage Vin is input and the output voltage VoutP of the operational amplifier 1 is not clipped, a potential of the positive phase input terminal (+) of the operational amplifier 1 is substantially the same as that of the circuit point A (i.e., an imaginary ground is established), so that a change of the input voltage Vin appears in the circuit point A as it is. Accordingly, a current flowing through the resistance element R2 becomes a current in accordance with the input voltage Vin. Since the current flowing through the resistance element R2 flows through the resistance element R3 as it is, a signal reversed of the output voltage VoutP of the operational amplifier 1 is output from the operational amplifier 2 as the output voltage VoutM of the operational amplifier 2.

Consideration will be given to a case in which neither the output voltage VoutP nor the output voltage VoutM is clipped. Assuming that an AC (alternate) current flowing through the resistance element R2 is i(R2), the output voltages VoutP and VoutM are given by the following expressions (5) and (6), and a closed loop gain GvP of the first operational amplifier 1 and a closed loop gain GvM of the second operational amplifier 2 can be given by the following expressions (7) and (8).

$$VoutP = Vin + R1 \cdot i(R2) = Vin + \frac{R1}{R2}Vin \qquad (5)$$

$$VoutM = -R3 \cdot i(R2) = -\frac{R3}{R2}Vin \qquad (6)$$

$$GvP = \frac{VoutP}{Vin} = \left(1 + \frac{R1}{R2}\right) = \frac{R1 + R2}{R2} \qquad (7)$$

$$GvM = \frac{VoutM}{Vin} = -\frac{R3}{R2} \qquad (8)$$

In the case where the input voltage Vin is increased and the output voltage VoutP of the operational amplifier 1 is clipped, the imaginary ground of the positive phase input terminal (+) of the operational amplifier 1 and the circuit point A is no longer established, that is, feedback is undo. Then, even when the input voltage Vin is further increased, the current flowing through the resistance element R2 is not changed and this current is in the state of i(R2)=0. Applying this state to formulas (5) to (8), it is found that the gain GvM of the operational amplifier 2 also becomes zero just when the output voltage VoutP of the operational amplifier 1 is clipped. In other words, even if the output voltage VoutM of the operational amplifier 2 is not clipped, it is impossible to further drive the output of the operational amplifier 2 to attain a further amplified output power.

More specifically, in the power amplifier shown in FIG. 6, it is necessary that, in order to attain a large maximum output power, the closed loop gains GvP and GvM of the operational amplifiers 1 and 2 are equal, variation of the on-resistances of output transistors at the driving side and the load side of each of the operational amplifiers 1 and 2 does not occur, and a reference voltage Ref is substantially a midpoint potential (Vcc/2) with respect to a power source voltage Vcc. When the reference voltage Ref is varied from Vcc/2, output residual voltages of the output transistors at the driving side and the load side of each of the operational amplifiers 1 and 2 are varied when the operational amplifiers 1 and 2 are clipped, and this leads to fail a large maximum output power. In order to attain a large maximum output power, it is necessary that the output residual voltages of the output transistors at the driving side and the load side are made small to the limit in which the output residual voltages of the output transistors at the driving side and the load side are determined by the on-resistance of the output transistor of the operational amplifier. However, it cannot be expected for the element configuring the power amplifier to be made so accurate as to satisfy the requirement. Hence, a large maximum output power cannot be attained.

(2) Next, the problem that the oscillation stability is low will be described. Generally, a main factor to determine the oscillation stability of a negative feedback amplifier circuit includes a feedback quantity. It is a well known matter that the more the feedback quantity is, the more the negative feedback amplifier circuit is easily oscillated. However, the power amplifier shown in FIG. 6 has a property that the feedback quantity is large in a high frequency input and the power amplifier is easily oscillated.

Here, a feedback quantity f1 that is a ratio of a voltage of the circuit point A with respect to the output voltage VoutP of the operational amplifier 1 is calculated. An impedance Z2 in a case where a view is taken from the side of the resistance element R2 to the circuit point C will be given by the following expression (9):

$$Z2 = \frac{Vc}{i} = \frac{Vc}{\frac{Vc - VoutM}{R3}} = \frac{R3}{1 + a2} \quad (9)$$

wherein a2 is the open loop gain of the operational amplifier 2; Vc is the voltage of the circuit point C, and VoutM=−a2×Vc. Therefore, f1 is the following expression (10).

$$f1 = \frac{R2 + \frac{R3}{1 + a2}}{R2 + \frac{R3}{1 + a2} + R1} \quad (10)$$

Here, it is known that, in general, a2 has a frequency property and a2 is small at a high frequency. From the expression (10), it is found that f1 has a frequency dependency and the larger the frequency becomes, the larger f1 becomes. It is found that, in the case of, for example, R1=3.6 kΩ, R2=400 Ω, and R3=4 kΩ, f1 is equal to 0.1 at a low frequency in which a2 is sufficiently large, and on the contrary, f1 is 0.4 at a high frequency in which a2 is equal to 1. In other words, in the power amplifier shown in FIG. 6, the feedback quantity at the high frequency input is increased, and this involves a problem that high frequency noise is superimposed on the output voltage and the oscillation stability is low.

Embodiments of the present invention will be described below, with reference to the drawings. In the following description, the same reference symbols are used for the same parts or portions.

First Embodiment

FIG. 1 is a circuit diagram of a BTL power amplifier according to a first embodiment of the present invention.

In the BTL power amplifier of FIG. 1, an input voltage Vin is input from a signal input terminal 10 to a positive phase input terminal (+) of a first operational amplifier 1, and an output voltage VoutP having the same phase as the input voltage Vin is output from a positive phase output terminal of the first operational amplifier 1. The positive phase output terminal of the first operational amplifier 1 configures one output terminal 11 of the BTL power amplifier. A first resistance element R1 for feedback is connected between the output terminal of the operational amplifier 1 and a circuit point A which is connected to a negative phase input terminal (−) of the first operational amplifier.

A second resistance element R2 and a third resistance element R3 are connected in series between the negative phase input terminal (−) of the first operational amplifier 1 and a negative phase input terminal (−) of a second operational amplifier 2. The junction of the second resistance element R2 and the third resistance element R3 constitutes a circuit point B.

A reference voltage Ref is input from a reference voltage terminal 13 into a positive phase input terminal (+) of the second operational amplifier 2, and an output voltage VoutM having an opposite phase to the input voltage Vin is output from an output terminal of the second operational amplifier 2. The output terminal of the second operational amplifier 2 configures the other output terminal of the BTL power amplifier. A fourth resistance element R4 for feedback is connected between the output terminal of the second operational amplifier 2 and a circuit point C which is connected to the negative phase input terminal (−) of the second operational amplifier 2.

A voltage divider circuit 14 for generating a midpoint voltage of the input voltage Vin is connected between the signal input terminal 10 and the reference voltage terminal 13. The voltage divider circuit 14 is formed of a fifth resistance element Rin1 and a sixth resistance element Rin2 connected in series. The junction of the fifth resistance element Rin1 and the sixth resistance element Rin2 constitutes a midpoint voltage circuit point D of the voltage divider circuit 14. An impedance conversion circuit 3 is connected between the midpoint voltage circuit point D of the voltage divider circuit 14 and the circuit point B of the junction node of the second resistance element R2 and the third resistance element R3. A resistance value ratio between the second resistance element R2 and the third resistance element R3 is 1:n (arbitrary number), and a resistance value ratio between the fifth resistance element Rin1 and the sixth resistance element Rin2 is equal to the resistance value ratio between the second resistance element R2 and the third resistance element R3.

Figure 2:
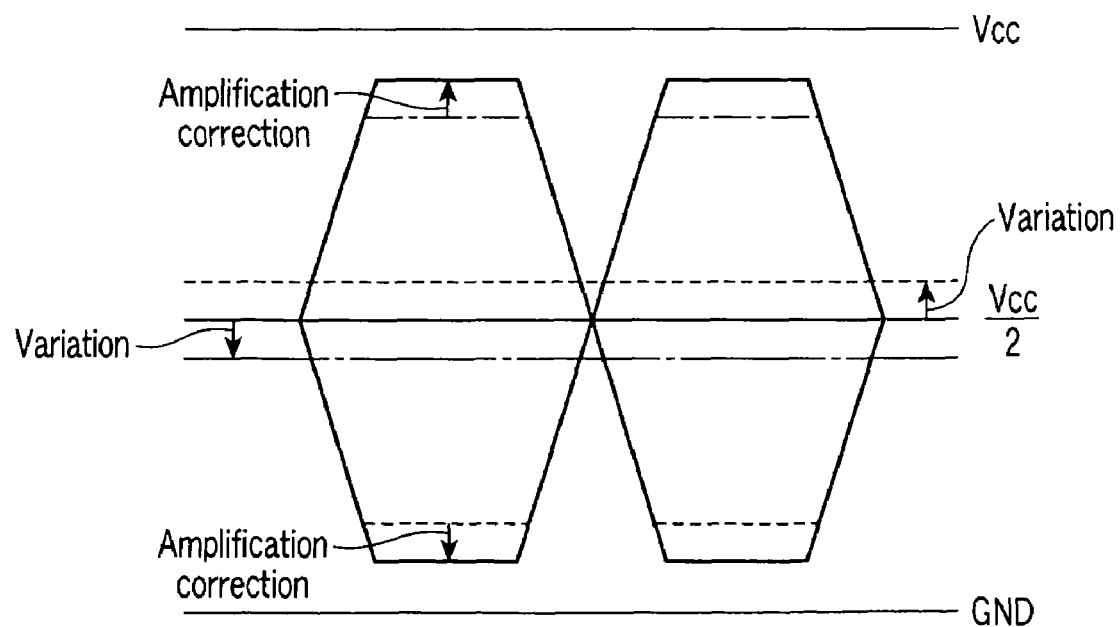
FIG. 2 is a waveform diagram showing the operation of the circuit shown in FIG. 1.

Next, the operation of the BTL power amplifier shown in FIG. 1 will be described with reference to a waveform diagram shown in FIG. 2. According to the present embodiment, the resistance value ratio between the fifth resistance element Rin1 and the sixth resistance element Rin2 is 1:1, and the resistance value ratio between the second resistance element R2 and the third resistance element R3 is also 1:1. Namely, Rin1=Rin2=Rin/2 and R2=R3 are established. Assuming that the impedance conversion circuit 3 is a buffer amplifier 3 of a gain 1, the voltage of Vin/2 generates at the midpoint voltage circuit point D.

(a) First, the maximum output power of the BTL power amplifier shown in FIG. 1 will be considered. Consideration will be given to a case in which neither the output voltage VoutP of the operational amplifier 1 nor the output voltage VoutM of the operational amplifier 2 is clipped.

Assuming that an open loop gain of the operational amplifier 1 and an open loop gain of the operational amplifier 2 are a1 and a2, respectively. In this case, when a1 and a2 are sufficiently large, a voltage between the positive phase input terminal (+) of the operational amplifier 1 and the circuit point A is approximately zero (i.e., the imaginary ground is established), and a voltage between the positive phase input terminal (+) of the operational amplifier 2 and the circuit point C is also approximately zero. Therefore, a voltage of Vin/2 is also generated at the circuit point B, i.e., the series-connection node of the resistance elements R2 and R3.

Accordingly, although the buffer amplifier 3 of the gain 1 is connected between the circuit point D and the circuit point B, supply and absorption of the current by the buffer amplifier 3 do not occur. In other words, there is no difference in the operation from the case where the buffer amplifier 3 is not provided. Here, representing an AC current flowing through the resistance element R2 by i(R2) and an AC current flowing through the resistance element R3 by i(R3), i(R2) and i(R3) will be given by the following expression (11).

$$i(R2) = i(R3) = \frac{Vin}{R2 + R3} = \frac{Vin}{2 \times R2} \quad (11)$$

The AC currents i(R2) and i(R3) in the expression (11) are supplied from the output terminal of the operational amplifier 1 via the resistance element R1, and flow into the output terminal of the operational amplifier 2 via the resistance element R4. When neither the output voltage VoutP of the operational amplifier 1 nor the output voltage VoutM of the operational amplifier 2 is clipped, the output voltages VoutP and VoutM are given by the following expressions (12) and (13), respectively, and the closed loop gain GvP of the operational amplifier 1 and the closed loop gain GvM of the operational amplifier 2 are given by the following expressions (14) and (15), respectively.

$$VoutP = Vin + R1 \cdot i(R2) = Vin + \frac{R1}{2 \times R2} Vin \quad (12)$$

$$VoutM = -R4 \cdot i(R3) = -\frac{R4}{2 \times R2} Vin \quad (13)$$

$$GvP = \frac{VoutP}{Vin} = \left(1 + \frac{R1}{2 \times R2}\right) = \frac{R1 + 2 \cdot R2}{2 \cdot R2} \quad (14)$$

$$GvM = \frac{VoutM}{Vin} = -\frac{R4}{2 \cdot R2} \quad (15)$$

Accordingly, as the output voltage VoutP of the operational amplifier 1 and the output voltage VoutM of the operational amplifier 2, signals having the reversed phase to each other are output so as to obtain a BTL signal.

On the other hand, consideration will be given to a case in which Vin becomes larger and either the output voltage VoutP of the operational amplifier 1 or the output voltage VoutM of the operational amplifier 2 is clipped, for example, a case in which the output voltage VoutP of the operational amplifier 1 is only clipped. In this case, the imaginary ground of the positive phase input terminal (+) of the operational amplifier 1 and the circuit point A is not established, that is, feedback is undo. However, since the output of the buffer amplifier 3 becomes Vin/2, the resistance elements R3 and R4 are driven by the buffer amplifier 3. In this case, the AC current i(R3) is given by the expression (16), and the output voltage VoutM of the operational amplifier 2 and the closed loop gain GvM of the operational amplifier 2 are given by the following expressions (17) and (18), respectively.

$$i(R3) = \frac{Vin}{2} \times \frac{1}{R3} = \frac{Vin}{2 \times R2} \quad (16)$$

-continued $$VoutM = -R4 \cdot i(R3) = -\frac{R4}{2 \times R2} Vin \quad (17)$$

$$GvM = \frac{VoutM}{Vin} = -\frac{R4}{2 \cdot R2} \quad (18)$$

In this case, it is noted that the current value shown in the expression (16) is equal to the current value just before clipping as shown in the expression (11). That is, due to the effect of the buffer amplifier 3, it is possible to provide an amplification operation to substantially make the output amplitude larger without change of the gain of the operational amplifier 2 which is not clipped, before and after the VoutP which is the output voltage of the operational amplifier 1 is clipped. The amplification correction operation by the buffer amplifier 3 is continued till both of the output voltage VoutP of the operational amplifier 1 and the output voltage VoutM of the operational amplifier 2 are clipped. When both of the output voltage VoutP of the operational amplifier 1 and the output voltage VoutM of the operational amplifier 2 are clipped, the buffer amplifier 3 does not provide the amplification correction operation, though it provides the amplification.

Accordingly, the BTL power amplifier according to the first embodiment has the following advantage. That is, even when the closed loop gains GvP and GvM of the operational amplifiers 1 and 2 are not equal to each other, or the output residual voltages (i.e., a voltage determined by an on-resistance of the output transistor of the operational amplifier) are varied when the operational amplifiers 1 and 2 are clipped, or the output voltages are varied when no signal is input in the operational amplifiers 1 and 2, the output residual voltages of the output transistors at the driving side and the load side of each of the operational amplifiers 1 and 2 can be made small to the limit in which the output residual voltages of the output transistors at the driving side and the load side of each of the operational amplifiers 1 and 2 are determined by the on-resistance of the output transistor of the operational amplifier. As a result, the BTL power amplifier can be sufficiently driven, and the maximum output power of the BTL power amplifier can be made sufficiently large.

(b) Next, the oscillation stability of the BTL power amplifier shown in FIG. 1 will be considered. Now, a feedback quantity f1 which is a ratio between the voltage at the circuit point A and the output voltage VoutP of the operational amplifier 1 is calculated. As described above, supply and absorption of the current by the buffer amplifier 3 do not occur in a low frequency in which the open loop gains a1 and a2 are sufficiently large. Thus, the output impedance of the buffer amplifier 3 does not relate to the feedback quantity f1. That is, the feedback quantity f1 at the low frequency can be approximately represented by the following expression (19).

$$f1 = \frac{R2 + R3}{R1 + R2 + R3} \quad (19)$$

On the other hand, at the high frequency (for example, several hundreds KHz to several MHz) where the open loop gains a1 and a2 are small, the output impedance of the buffer amplifier 3 affects the feedback quantity f1. Briefly estimating, an impedance Zc in the case where a view is taken from the side of the resistance element R3 to the circuit point C can be represented by the following expression (20).

$$Zc = \frac{Vc}{i(R4)} = \frac{Vc}{\frac{Vc - VoutM}{R4}} = \frac{R4}{1 + a2} \quad (20)$$

where, a2 is the open loop gain of the operational amplifier 2, Vc is a terminal voltage of the circuit point C, and VoutM=−a2×Vc is established. Assuming that the output impedance of the buffer amplifier 3 is r0, the impedance Zb in the case where a view is taken from the side of the resistance element R2 to the circuit point B is substantially represented by the following expression (21). When the buffer amplifier 3 is configured by an emitter follower circuit or the like, the buffer amplifier 3 is normally more excellent than the operational amplifiers 1 and 2 in the high frequency property, so that the output impedance r0 of the buffer amplifier 3 becomes dominant with respect to the impedance Zb.

$$Zb \approx r0 // (R3 + Zc) \approx r0 \quad (21)$$

Therefore, the feedback quantity f1 at the high frequency can be represented by the following expression (22).

$$f1 = \frac{R2 + Zb}{R1 + R2 + Zb} = \frac{R2 + r0}{R1 + R2 + r0} \quad (22)$$

Consequently, by using an emitter follower of a broad band having a high input impedance and a low output impedance, the oscillation stability of the BTL amplifier can be improved even at the high frequency without making the feedback quantity f1 extremely large.

In addition, since an offset voltage generated between the input and the output of the buffer amplifier 3 is evenly applied to the resistance elements R2 and R3, the offset between the BTL outputs VoutP and VoutM is not increased. It means that there is no necessity to use a high-accuracy amplifier of a low offset, and the emitter follower which can be easily designed may be used. Further, in the BTL power amplifier shown in FIG. 1, a preamplifier for obtaining the BTL output signal from Vin is not required. Thus, as compared to the case that a preamplifier is employed, a low offset voltage and a low noise can be expected.

Therefore, according to the BTL amplifier shown in FIG. 1, it is possible to realize a high-accuracy amplifier having a simple configuration, a low output offset voltage, a low noise and excellent oscillation stability, without failing the maximum output power. The BTL amplifier of the present embodiment is preferably used in particular for a power amplifier for car audio of a high output specification in which the maximum output power is important.

Concrete Example of First Embodiment

Figure 3:
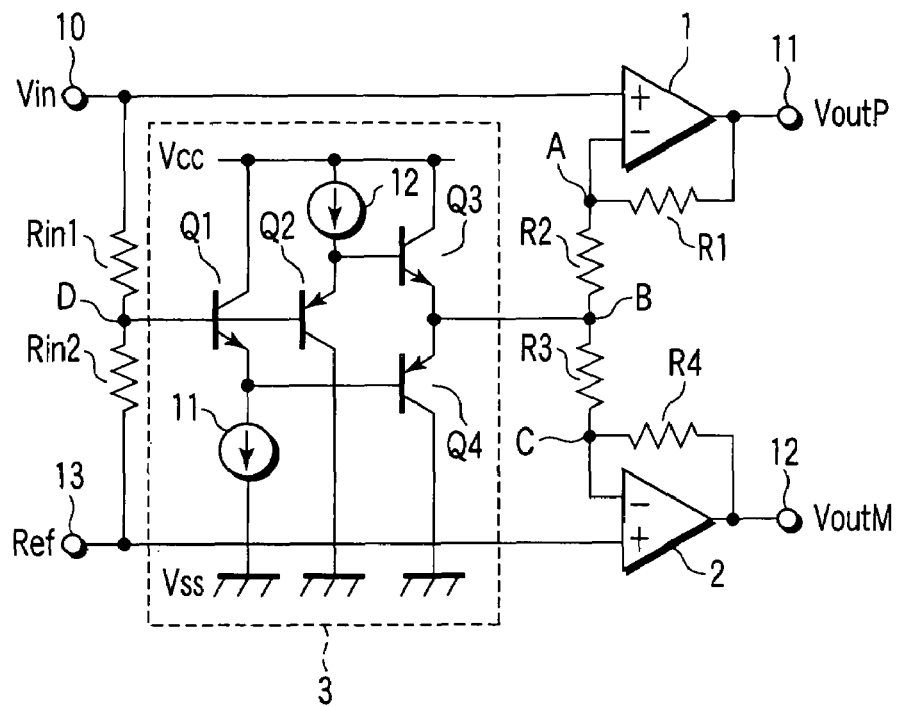
FIG. 3 is a diagram showing a configuration of a buffer amplifier in detail in the BTL power amplifier shown in FIG. 1.

FIG. 3 is a diagram showing a configuration of a buffer amplifier in detail in the BTL power amplifier shown in FIG. 1.

In the buffer amplifier 3 of the BTL power amplifier shown in FIG. 3, an npn transistor Q1 has a base which is connected to the circuit point D which constitutes an input node of the buffer amplifier 3, a collector which is connected to a power source node Vcc, and an emitter which is connected to a ground node Vss via a constant current source I1. A pnp transistor Q2 has a base which is connected to the circuit point D, a collector which is connected to the ground node Vss, and an emitter connected to the power source node Vcc via a constant current source I2. An npn transistor Q3 has a base which is connected to the emitter of the pnp transistor Q2, a collector which is connected to the power source node Vcc, and an emitter which is connected to the circuit point B which constitutes an output node of the buffer amplifier 3. A pnp transistor Q4 has a base which is connected to the emitter of the npn transistor Q1, a collector which is connected to the ground node Vss, and an emitter which is connected to the circuit point B which constitutes the output node of the buffer amplifier 3.

Modification Example of First Embodiment

Figure 4:
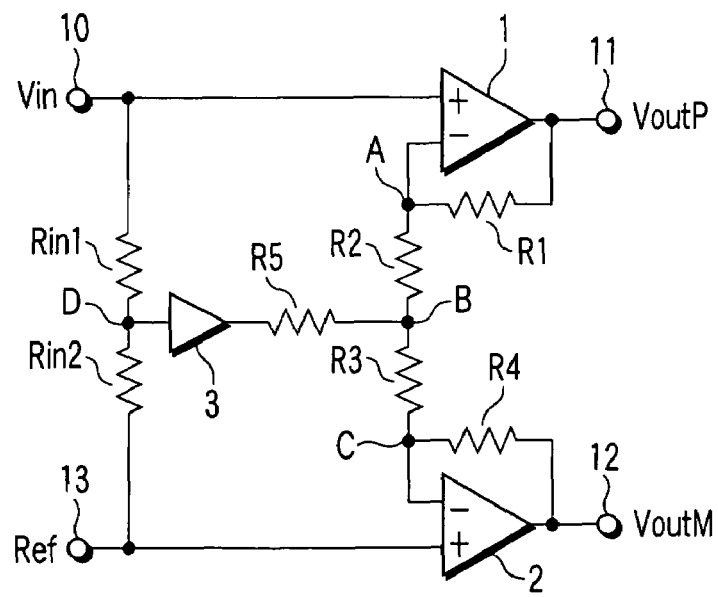
FIG. 4 is a circuit diagram of a BTL power amplifier according to a modified example of the first embodiment of the invention.

FIG. 4 is a circuit diagram of a BTL power amplifier according to a modified example of the first embodiment of the invention.

The circuit shown in FIG. 4 is different from the circuit described above with reference to FIG. 1 in that a resistance element R5 is connected between the output node of the buffer amplifier 3 and the circuit point B and other circuit points are the same.

Second Embodiment

FIG. 5 is a circuit diagram of a BTL power amplifier according to a second embodiment of the present invention.

The BTL power amplifier shown in FIG. 5 is different from the BTL power amplifier according to the first embodiment described above with reference to FIG. 1 in that a resistance element R5 is connected between the output node of the buffer amplifier 3 and the circuit point B, a resistance element R6 for input protection is connected between the signal input terminal 10 and the positive phase input terminal (+) of the operational amplifier 1, a resistance element R7 for input protection is connected between an alternate current ground (ACGND) terminal 15 and the positive phase input terminal (+) of the operational amplifier 2, and resistance elements Rin3 and Rin4 are connected in series between the reference input (Ref) terminal 13 and the alternate current ground terminal 15.

In this manner, it is possible to match the impedance in the case where a view is taken from the reference input (Ref) terminal 13 to the positive phase input terminal of the operational amplifier 1 with the impedance in the case where a view is taken from the reference input terminal 13 to the positive phase input terminal of the operational amplifier 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier circuit of a BTL system, comprising:
   a first operational amplifier circuit which outputs an output signal having a same phase as an input signal input to a signal input terminal;
   a second operational amplifier circuit which outputs an output signal having an opposite phase to the input signal;
   a voltage dividing circuit which generates a midpoint voltage of the input signal;

a first resistance element which is connected between an output terminal of the first operational amplifier circuit and a negative phase input terminal of the first operational amplifier circuit;

a second resistance element and a third resistance element which are connected in series between the negative phase input terminal of the first operational amplifier circuit and a negative phase input terminal of the second operational amplifier circuit;

a fourth resistance element which is connected between an output terminal of the second operational amplifier circuit and the negative phase input terminal of the second operational amplifier circuit; and an impedance conversion circuit which is connected between a midpoint voltage node of the voltage dividing circuit and a series-connection node of the second resistance element and the third resistance element, the impedance conversion circuit being connected directly to the series-connection node of the second resistance element and the third resistance element.

2. The amplifier circuit of a BTL system according to claim 1, wherein
the voltage dividing circuit comprises a fifth resistance element and a sixth resistance element which are connected in series between a positive phase input terminal of the first operational amplifier circuit and a reference input terminal, and
a resistance value ratio of the fifth resistance element and the sixth resistance element is substantially equal to a resistance value ratio of the second resistance element and the third resistance element.

3. The amplifier circuit of a BTL system according to claim 2, wherein
the resistance value ratio of the fifth resistance element and the sixth resistance element is 1:n, where n is an arbitrary number, and the resistance value ratio of the second resistance element and the third resistance element is 1:n, where n is an arbitrary number.

4. The amplifier circuit of a BTL system according to claim 2, further comprising:
a seventh resistance element which is connected between the signal input terminal and the positive phase input terminal of the first operational amplifier circuit;
an eight resistance element which is connected between an alternate current ground terminal and a positive phase input terminal of the second operational amplification circuit; and
a ninth resistance element and a tenth resistance element which are connected between the reference input terminal and the alternate current ground terminal.

5. The amplifier circuit of a BTL system according to claim 1, wherein
a positive phase input terminal of the first operational amplifier circuit is connected to the signal input terminal, and a positive phase input terminal of the second operational amplifier circuit is connected to a reference input terminal.

6. The amplifier circuit of a BTL system according to claim 1, wherein
the impedance conversion circuit comprises an emitter follower type circuit.

7. An amplifier circuit of a BTL system, comprising:
a first operational amplifier circuit which outputs an output signal having a same phase as an input signal input to a signal input terminal;

a second operational amplifier circuit which outputs an output signal having an opposite phase to the input signal;

a midpoint voltage generating circuit which generates a midpoint voltage of the input signal;

a first feedback circuit which is connected between an output terminal of the first operational amplifier circuit and a negative phase input terminal of the first operational amplifier circuit;

a series resistance circuit which is formed of series connected resistances which are connected in series between the negative phase input terminal of the first operational amplifier circuit and a negative phase input terminal of the second operational amplifier circuit;

a second feedback circuit which is connected between an output terminal of the second operational amplifier circuit and the negative phase input terminal of the second operational amplifier circuit; and an impedance conversion circuit which is connected between a midpoint voltage output node of the midpoint voltage generating circuit and a series-connection node of the series connected resistances of the series resistance circuit, the impedance conversion circuit being connected directly to the series-connection node of the second resistance element and the third resistance element.

8. The amplifier circuit of a BTL system according to claim 7, wherein
the midpoint voltage generating circuit comprises a voltage dividing circuit formed of a first resistance element and a second resistance element which are connected in series between the signal input terminal and the reference input signal, a series-connection node of the first resistance element and the second resistance element constituting the midpoint voltage output node of the midpoint voltage generating circuit.

9. The amplifier circuit of a BTL system according to claim 7, wherein
the series resistance circuit comprises a first resistance element and a second resistance element which are connected in series between the negative phase input terminal of the first amplifier circuit and the negative phase input terminal of the second amplifier circuit, a series-connection node of the first resistance element and the second resistance element constituting the series-connection node of the series connected resistances of the series resistance circuit.

10. The amplifier circuit of a BTL system according to claim 7, wherein
the midpoint voltage generating circuit comprises a first resistance element and a second resistance element which are connected in series between the signal input terminal and a reference input signal,
the series resistance circuit comprises a first resistance element and a second resistance element which are connected in series between the negative phase input terminal of the first amplifier circuit and the negative phase input terminal of the second amplifier circuit, and
a resistance value ratio of the first resistance element and the second resistance element of the midpoint voltage generating circuit is substantially equal to a resistance value ratio of the first resistance element and the second resistance element of the series resistance circuit.

11. The amplifier circuit of a BTL system according to claim 10, wherein
the resistance value ratio of the first resistance element and the second resistance element of the midpoint voltage generating circuit is 1:n, where n is an arbitrary number, and the resistance value ratio of the first resistance element and the second resistance element of the series resistance circuit is 1:n, where n is an arbitrary number.

12. The amplifier circuit of a BTL system according to claim 7, wherein
a positive phase input terminal of the first operational amplifier circuit is connected to the signal input terminal, and a positive phase input terminal of the second operational amplifier circuit is connected to a reference input terminal.

13. The amplifier circuit of a BTL system according to claim 7, wherein
the first feedback circuit connected between the output terminal and the negative phase input terminal of the first operational amplifier circuit comprises a resistance element, and the second feedback circuit connected between the output terminal and the negative phase input terminal of the second operational amplifier circuit comprises a resistance element.

14. The amplifier circuit of a BTL system according to claim 7, further comprising:
a first input protection circuit which is connected between the signal input terminal and a positive phase input terminal of the first operational amplification circuit;
a second input protection circuit which is connected between an alternate current ground terminal and a positive phase input terminal of the second operational amplification circuit; and
a resistance circuit which is connected between the reference input terminal and the alternate current ground terminal.

15. The amplifier circuit of a BTL system according to claim 14, wherein
the first input protection circuit and the second input protection circuit each comprise a resistance element, and
the resistance circuit comprises a first resistance element and a second resistance element which are connected in series between the reference input terminal and the alternate current ground terminal.

16. The amplifier circuit of a BTL system according to claim 7, wherein
the impedance conversion circuit comprises a buffer amplifier circuit.

17. The amplifier circuit of a BTL system according to claim 7, wherein
the impedance conversion circuit comprises an emitter follower type circuit.

18. The amplifier circuit of a BTL system according to claim 7, wherein the impedance conversion circuit comprises:
a first npn transistor having a base which is connected to the midpoint voltage output node of the midpoint voltage generating circuit which constitutes an input node of the impedance conversion circuit, a collector which is connected to a power source node; and an emitter which is connected to a ground node via a first constant current source;
a first pnp transistor having a base which is connected to the midpoint voltage output node of the midpoint voltage generating circuit, a collector which is connected to the ground node, and an emitter which is connected to a power source node via a second constant current source;
a second npn transistor having a base which is connected to the emitter of the first pnp transistor, a collector which is connected to the power source node, and an emitter which is connected to the series-connection node of the series resistance circuit which constitutes an output node of the impedance conversion circuit; and
a second pnp transistor having a base which is connected to the emitter of the first npn transistor, a collector which is connected to the ground node, and an emitter which is connected to the series-connection node of the series resistance circuit.

19. An amplifier circuit of a BTL system comprising:
a first operational amplifier circuit which outputs an output signal having a same phase as an input signal input to a signal input terminal;
a second operational amplifier circuit which outputs an output signal having an opposite phase to the input signal;
a voltage dividing circuit which generates a midpoint voltage of the input signal;
a first resistance element which is connected between an output terminal of the first operational amplifier circuit and a negative phase input terminal of the first operational amplifier circuit;
a second resistance element and a third resistance element which are connected in series between the negative phase input terminal of the first operational amplifier circuit and a negative phase input terminal of the second operational amplifier circuit;
a fourth resistance element which is connected between an output terminal of the second operational amplifier circuit and the negative phase input terminal of the second operational amplifier circuit;
an impedance conversion circuit which is connected between a midpoint voltage node of the voltage dividing circuit and a series-connection node of the second resistance element and the third resistance element;
the voltage dividing circuit comprises a fifth resistance element and a sixth resistance element which are connected in series between a positive phase input terminal of the first operational amplifier circuit and a reference input terminal;
a resistance value ratio of the fifth resistance element and the sixth resistance element is substantially equal to a resistance value ratio of the second resistance element and the third resistance element;
a seventh resistance element which is connected between the signal input terminal and the positive phase input terminal of the first operational amplifier circuit;
an eight resistance element which is connected between an alternate current terminal and a positive phase input terminal of the second operational amplification circuit; and
a ninth resistance element and a tenth resistance element which are connected between the reference input terminal and the alternate current ground terminal.

20. An amplifier circuit of a BTL system comprising:
a first operational amplifier circuit which outputs an output signal having a same phase as an input signal input to a signal input terminal;
a second operational amplifier circuit which outputs an output signal having an opposite phase to the input signal;
a midpoint voltage generating circuit which generates a midpoint voltage of the input signal;
a first feedback circuit which is connected between an output terminal of the first operational amplifier circuit and a negative phase input terminal of the first operational amplifier circuit;
a series resistance circuit which is formed of series connected resistances which are connected in series between the negative phase input terminal of the first operational amplifier circuit and a negative phase input terminal of the second operational amplifier circuit;

a second feedback circuit which is connected between an output terminal of the second operational amplifier circuit and the negative phase input terminal of the second operational amplifier circuit;

an impedance conversion circuit which is connected between a midpoint voltage output node of the midpoint voltage generating circuit and a series-connection node of the series connected resistances of the series resistance circuit;

a first input protection circuit which is connected between the signal input terminal and a positive phase input terminal of the first operational amplification circuit;

a second input protection circuit which is connected between an alternate current ground terminal and a positive phase input terminal of the second operational amplification circuit; and a resistance circuit which is connected between the reference input terminal and the alternate current ground terminal.

21. The amplifier circuit of a BTL system according to claim 20, wherein the first input protection circuit and the second input protection circuit each comprise a resistance element, and the resistance circuit comprises a first resistance element and a second resistance element which are connected in series between the reference input terminal and the alternate current ground terminal.

* * * * *